(12) United States Patent
Kim

(10) Patent No.: US 7,075,144 B2
(45) Date of Patent: Jul. 11, 2006

(54) NON-VOLATILE MEMORY DEVICE

(75) Inventor: Seong-Gyun Kim, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/133,988

(22) Filed: May 20, 2005

(65) Prior Publication Data

US 2005/0218444 A1    Oct. 6, 2005

Related U.S. Application Data

(60) Continuation of application No. 10/862,973, filed on Jun. 8, 2004, now Pat. No. 6,922,361, which is a division of application No. 10/123,672, filed on Apr. 16, 2002, now Pat. No. 6,768,681.

(30) Foreign Application Priority Data

Apr. 25, 2001 (KR) .............................. 2001-22389

(51) Int. Cl.
*H01L 29/792* (2006.01)
*H01L 29/788* (2006.01)
*G11C 16/04* (2006.01)

(52) U.S. Cl. ...................... 257/324; 257/315; 257/316; 257/325; 365/185.01; 365/185.03; 365/185.05

(58) Field of Classification Search .......... 365/185.03, 365/185.1, 72, 185.01; 257/314, 315, 316, 257/324, 325
See application file for complete search history.

(56) References Cited

U.S. PATENT DOCUMENTS

| | | | |
|---|---|---|---|
| 4,446,535 A | 5/1984 | Gaffney et al. ............. 365/149 |
| 5,021,999 A * | 6/1991 | Kohda et al. ........... 365/185.03 |
| 5,412,596 A | 5/1995 | Hoshiba ...................... 365/145 |
| 5,446,688 A | 8/1995 | Torimaru .................... 365/145 |
| 5,467,302 A | 11/1995 | Hirano et al. ............... 361/145 |
| 5,494,838 A | 2/1996 | Chang et al. .................. 437/43 |
| 5,745,402 A | 4/1998 | Arase .......................... 365/145 |
| 5,751,628 A | 5/1998 | Hirano et al. ............... 365/145 |
| 5,768,192 A | 6/1998 | Eitan ...................... 365/185.24 |
| 5,841,693 A * | 11/1998 | Tsukiji .................. 365/185.01 |
| 5,910,912 A | 6/1999 | Hsu et al. ............. 365/185.01 |
| 5,910,925 A | 6/1999 | Guterman et al. ..... 365/230.01 |
| 5,943,284 A | 8/1999 | Mizuno et al. ........ 365/230.03 |
| 6,057,575 A | 5/2000 | Jenq ........................... 257/319 |
| 6,091,101 A * | 7/2000 | Wang ......................... 257/315 |
| 6,107,141 A | 8/2000 | Hsu et al. ................... 438/267 |
| 6,151,248 A * | 11/2000 | Harari et al. .......... 365/185.14 |
| 6,256,216 B1 | 7/2001 | Lien et al. ..................... 365/49 |
| 6,282,118 B1 | 8/2001 | Lung et al. ............. 365/185.08 |

(Continued)

*Primary Examiner*—Amir Zarabian
*Assistant Examiner*—Ly Duy Pham
(74) *Attorney, Agent, or Firm*—Mills & Onello LLP

(57) ABSTRACT

The present invention includes a method of fabricating a non-volatile memory device having two transistors for two-bit operations to improve electron trapping efficiency and integration degree of the non-volatile memory device, and a method of driving the non-volatile memory device. The EEPROM device according to the present invention comprises a silicon substrate including a first and a second channel area, a first and a second conductive gate on the first and the second channel area, respectively, facing each other, a first and a second insulation layer in the bottom of the first and the second gate, and a first and a second junction area of a second conductive type between the first and the second channel area overlapping with the first and the second conductive gate.

10 Claims, 11 Drawing Sheets

U.S. PATENT DOCUMENTS

| | | | |
|---|---|---|---|
| 6,317,349 B1 | 11/2001 | Wong | 365/49 |
| 6,434,053 B1 * | 8/2002 | Fujiwara | 365/185.28 |
| 6,438,016 B1 | 8/2002 | Keeth et al. | 365/63 |
| 6,504,756 B1 | 1/2003 | Gonzalez et al. | 365/185.18 |
| 6,577,531 B1 | 6/2003 | Kato | 123/488 |
| 6,707,079 B1 * | 3/2004 | Satoh et al. | 257/288 |
| 6,764,905 B1 * | 7/2004 | Jeng et al. | 438/267 |
| 2002/0196663 A1 | 12/2002 | Kuo | 365/185.18 |

* cited by examiner

NON-VOLATILE MEMORY DEVICE

RELATED APPLICATIONS

This application is a continuation of U.S. application Ser. No. 10/862,973, filed on Jun. 8, 2004, now U.S. Pat. No. 6,922,361, which is a divisional of U.S. application Ser. No. 10/123,672, filed on Apr. 16, 2002, now U.S. Pat. No. 6,768,681, which relies for priority upon Korean Patent Application No. 2001-22389, filed on Apr. 25, 2001, the contents of all of which are herein incorporated by reference in their entirety.

BACKGROUND OF THE INVENTION

1. Field of the Invention

The present invention relates to a non-volatile semiconductor memory device, more particularly, to a method of fabricating an oxide-nitride-oxide ONO electrically erasable and programmable read only memory EEPROM device having two transistors for performing two bit operations, and a method of driving the ONO EEPROM device.

2. Description of Related Art

An ONO EEPROM device is one type of non-volatile semiconductor memory device and has an oxide-nitride-oxide (ONO) layer in the bottom of a gate. The nitride layer in the ONO EEPROM device is a dielectric layer trapping or de-trapping electrons for data programming, data erasing, and data readout in a memory cell.

Generally, the ONO EEPROM device applies a Fowler-Nordheim (F-N) tunneling phenomenon or channel hot electron injection (CHEI) to trap electrons. The F-N tunneling method consumes less current to trap electrons, but has longer trapping time. In contrast, the CHEI method has shorter trapping time, but consumes more current to trap electrons so that the number of electron-trapping cells is limited.

U.S. Pat. No. 5,768,192 discloses an ONO non-volatile memory device applying the CHEI method to trap electrons in the nitride layer. FIG. 1a illustrates a cross sectional configuration for a unit cell of a conventional ONO EEPROM device applying a CHEI method to write a data, that is, to program a data. FIG. 1b shows an equivalent circuit diagram for the unit cell of the conventional ONO EEPROM device.

Referring to FIG. 1a and FIG. 1b, the unit cell of the conventional ONO EEPROM device 10 comprises a cell transistor CT11 having a conductive gate 30 connected to a word line WL11 and source/drain junction areas 41 and 42 connected to a pair of bit lines BL11 and BL12, respectively.

The conventional ONO EEPROM device comprises a trapping dielectric layer 25 with the ONO structure stacking serially a bottom oxide layer 21, a nitride layer 22, and a top oxide layer 23 on a silicon substrate of a first conductive type, for example, on a channel area 43 of a p-type silicon substrate 20.

The conductive gate 30 connected to the word line WL11 is formed on the trapping dielectric layer 25. The source/drain junction areas 41 and 42 are formed on the silicon substrate 20, below both sides of the conductive gate 30, and are overlapped with the conductive gate 30.

The bottom oxide layer 21 of the trapping dielectric layer 25 is an electric isolation layer for the channel area 43 and the top oxide layer 23 is an electric isolation layer for the word line WL11. The nitride layer 22 between the bottom oxide layer 21 and the top oxide layer 23 is an electron-trapping layer for data retention.

The above described conventional EEPROM device applies pre-determined voltages to the conductive gate 30 and to a pair of bit lines, BL11 and BL12, connected to the source/drain junction areas 41 and 42, respectively. Therefore, the electrons in the channel layer are trapped on the nitride layer 22 so that data is written in a corresponding memory cell.

The conventional EEPROM device applies the CHEI method to program data to a memory cell. The CHEI method requires a considerable amount of current for writing data to numerous memory cells. Therefore, a confined amount of current also limits the number of memory cells for writing data.

In addition, excessive electron de-trapping in an electron-trapping layer generates disturbance phenomena for erasing data in a memory cell when the data in the memory cell of the conventional EEPROM device is erased, which results in lowering device reliability of the conventional EEPROM device.

SUMMARY OF THE INVENTION

To overcome the above-described problems in conventional technology, the present invention provides a fabricating method of an ONO EEPROM device improving electron trapping efficiency and reducing trapping current, and a method of driving the ONO EEPROM device thereof.

Another purpose of the present invention is to provide a fabricating method of an ONO EEPROM device employing a split word line to improve electron-trapping efficiency in the CHEI method, and a method of driving the ONO EEPROM device thereof.

Another purpose of the present invention is to provide a fabricating and driving method of an EEPROM device employing a split word line with an ONO dielectric layer to form two memory cells between a pair of bit lines, and thereby improve integration degree of the EEPROM device.

Another purpose of the present invention is to provide a fabricating and driving method of an EEPROM device preventing disturbance phenomena from erasing data to improve reliability of the EEPROM device.

Another purpose of the present invention is to provide a fabricating and driving method of an ONO EEPROM device having two transistor cells between a pair of bit lines, and employing each of the transistor cells as a selection transistor cell to improve disturbance immunity of the EEPROM device.

Another purpose of the present invention is to provide a fabricating and driving method of an ONO EEPROM device applying a self-align method to generate a split word line, thereby reducing cell size.

The present invention is directed to a non-volatile memory device which includes a silicon substrate of a first conductivity type having first and second channel areas adjacent each other. First and second conductive gates are formed on the first and the second channel areas facing each other. First and second insulation layers are formed on the bottoms of the first and the second conductive gate, and on the silicon substrate between the first and the second conductive gate. First and second junction areas of a second conductivity type are formed in the silicon substrate overlapping with the first and the second conductive gate, wherein the first and the second channel areas are defined as a space between the first and the second junction areas.

In one embodiment, the first conductive gate is a control gate and the second conductive gate is a selection gate.

Alternatively, the first conductive gate is a selection gate and the second conductive gate is a control gate.

The first and the second insulation layers can include ONO layers including a nitride layer between oxide layers as an electron trapping layer.

The portion of the ONO layers formed in the bottom of the first and the second conductive gates functions as dielectric layers for trapping electrons, and the portion of the ONO layers formed between the first and the second conductive gates functions as an insulation layer.

The present invention is also directed to a non-volatile memory device comprising: a silicon substrate of a first conductivity type including first and second channel areas adjacent each other; first and second conductive gates formed on the first and the second channel areas, respectively, facing each other; first and second, including electron trapping layers, formed in the bottom of the first and the second conductive gates, and on the silicon substrate between the first and the second conductive gates; and first and second junction areas of a second conductivity type formed in the silicon substrate overlapping with the first and the second conductive gates, wherein the first and the second channel areas are defined as a space between the first and the second junction areas, the non-volatile memory device uses one of the conductive gates as a selection gate while the other of the conductive gates functions as a control gate so that the conductive gates are driven independently from each other, and applies an electric field to the control gate to trap electrons of a channel area in the bottom of the selection gate to the electron trapping layer of the dielectric layers in the bottom of the control gate so that each bit data is respectively stored in each of the dielectric layers.

The present invention is also directed to a non-volatile memory device comprising: a pair of bit lines; a pair of word lines; and a unit cell having first and second memory cells connected between the pair of bit lines, wherein the first memory cell formed in a first channel area of a first conductivity type silicon substrate comprises: a first conductive gate connected to one word line of the pair of word lines; a first dielectric layer including an electron trapping layer formed in the bottom and a side wall of the first conductive gate; and a first junction area of a second conductivity type which is connected to one bit line of the pair of bit lines being overlapped with the first conductive gate, and wherein the second memory cell formed in a second channel area facing the first conductive gate, comprises: a second conductive gate connected to the other word line of the pair of word lines; a second dielectric layer including an electron trapping layer formed in the bottom and a side wall of the second conductive gate; and a second junction area of the second conductivity type which is connected to the other bit line of the pair of bit lines, and overlapped with the second conductive gate.

The first and the second dielectric layers can include corresponding first and second ONO layers, each including a nitride layer between oxide layers as an electric trapping layer.

The present invention is also directed to a non-volatile memory device comprising: a pair of bit lines; a pair of word lines; and a unit cell having first and second memory cells connected between the pair of bit lines, wherein the first memory cell formed in a first channel area of a first conductivity type silicon substrate, comprises: a first conductive gate connected to one word line of the pair of word lines; a first dielectric layer including an electron trapping layer formed in the bottom and a side wall of the first conductive gate; and a first junction area of a second conductive type which is connected to one bit line of the pair of bit lines being overlapped with the first conductive gate, and wherein the second memory cell formed in a second channel area facing the first conductive gate, comprises: a second conductive gate connected to the other word line of the pair of word lines; a second dielectric layer including an electron trapping layer formed in the bottom and a side wall of the second conductive gate; and a second junction area of the second conductivity type which is connected to the other bit line of the pair of bit lines, and overlapped with the second conductive gate, the non-volatile memory device uses one of the memory cells as a data cell for storing data, and the other of the memory cells functions as a selection cell for selecting a cell so that each of the memory cells store one bit data.

In one embodiment, the non-volatile memory device programs data to a data cell, wherein: a first high voltage is applied to one bit line of the pair of bit lines connected to the junction area of the data cell; the other bit line of the pair of bit lines connected to the junction area of the selection cell is grounded; the substrate of the first conductivity type is grounded; a second high voltage is applied to one word line of the pair of word lines connected to the conductive gate of the selection cell; and a low voltage is applied to the other word line of the pair of word lines connected to the conductive gate of the data cell.

In one embodiment, the non-volatile memory device erases the programmed data of the data cell, wherein: the first high voltage is applied to one bit line of the pair of bit lines connected to the junction area of the data cell; the low voltage is applied to the other bit line of the pair of bit lines connected to the junction area of the selection cell, and to one word line of the pair of word lines connected to the conductive gate of the selection cell; the other word line of the pair of word lines connected to the conductive gate of the data cell is grounded; and the substrate is grounded.

In one embodiment, the non-volatile memory device reads the programmed data from the data cell, wherein: one bit line of the pair of bit lines connected to the junction area of the data cell is grounded; the substrate of the first conductivity type is grounded; a readout voltage is applied to the other bit line of the pair of bit lines connected to the junction area of the selection cell; a readout voltage is also applied to one word line of the pair of word lines connected to the conductive gate of the data cell; and the low voltage is applied to the other word line of the pair of word lines connected to the conductive gate of the selection cell.

In one embodiment, the first high voltage is 8 to 10 V; the second high voltage is 9 to 12 V; the low voltage is 4 to 5 V; and the readout voltage is a value between a programming threshold voltage and an erasing threshold voltage to the data cell.

The junction area of the selection cell can functions as a source area of the data cell in programming a data.

The present invention is also directed to a non-volatile memory device comprising: a pair of bit lines; a pair of word lines; and a unit cell connected between the pair of bit lines, wherein each of the conductive gates is connected to each word line of the pair of word lines, the non-volatile memory device stores one-bit data to each of the transistors.

The present invention is also directed to a non-volatile memory device comprising: a pair of bit lines; a pair of word lines; and a unit cell, connected between a pair of bit lines, comprising a pair of transistors with two terminals. The non-volatile memory device connects one terminal of the pair of transistors to the pair of word lines, respectively, and the other terminal of the pair of transistors to the pair of bit lines, respectively.

In one embodiment, one transistor of the pair of transistors functions as a cell transistor, and the other of the pair of transistors functions as a selection transistor so that each of the pair of transistors stores one-bit data independently from each other.

In one embodiment, the non-volatile memory device programs data to a selected transistor of the pair of the transistors in the unit cell, wherein a first high voltage is applied to one bit line of the pair of bit lines connected to the selected transistor; a second high voltage is applied to one word line of the pair of word lines connected to the selected transistor; a low voltage is applied to the other bit line of the pair of bit lines connected to the non-selected transistor; a ground voltage is applied to the other word line of the pair of word lines connected to the non-selected transistor.

In one embodiment, the non-volatile memory device erases the programmed data of the selected transistor, wherein the first high voltage is applied to one bit line of the pair of bit lines connected to the selected transistor; the low voltage is applied to one word line of the pair of word lines connected to the selected transistor; the low voltage is applied to the other bit line of the pair of bit lines connected to the non-selected transistor; and the ground voltage is applied to the other word line of the pair of word lines connected to the non-selected transistor.

In one embodiment, the non-volatile memory reads the programmed data from the selected transistor, wherein the ground voltage is applied to one bit line of the pair of bit lines connected to the selected transistor; a readout voltage is applied to one word line of the pair of word lines connected to the selected transistor; a readout voltage is also applied to the other bit line of the pair of bit lines connected to the non-selected transistor; and the ground voltage is also applied to the other word line of the pair of word lines connected to the non-selected transistor.

In one embodiment, the selected transistor functions as a cell transistor and the non-selected transistor functions as a selected transistor.

In one embodiment, the first high voltage is 8 to 10 V; the second high voltage is 9 to 12 V; the low voltage is 4 to 5 V; and the readout voltage has a value between a threshold voltage of programming a data and a threshold voltage of erasing a data.

The present invention is also directed to a method of programming bit data to a first and a second memory cell of a unit cell in a non-volatile memory device independently from each other, comprising a pair of bit lines, a pair of word lines, and a unit cell between the pair of bit lines including a first and a second memory cell, wherein the first and the second memory cell are respectively formed in the first and the second junction area on the silicon substrate, wherein the first and the second memory cell comprise conductive gates including an electron trap layer generated in the above channel area, and junction areas of the second conductive type, overlapped with the conductive gate, formed on the substrate, and connected to each bit line of the pair of bit lines, and wherein one of the first and the second memory cell functions as a data cell for storing a data and the other of the first and the second memory cell functions as a selection cell for selecting a cell, and each of the first and the second memory cell store one-bit data, the method of programming data comprising the step of: applying a ground voltage to one bit line of the pair of bit lines of the selection cell, and a low voltage to one word line of the pair of word lines of the selection cell; applying high voltages to the other bit line of the pair of bit lines of the data cell, and to the other word line of the pair of word lines of the data cell; and trapping electrons in the channel area of the selection cell to electron trapping layer of the data cell by the high voltage applied to the other word line of the pair of word lines of the data cell.

The present invention is also directed to a method of erasing bit data of a first and a second memory cell of a unit cell in a non-volatile memory device independently from each other, comprising a pair of bit lines, a pair of word lines, and a unit cell between the pair of bit lines including a first and a second memory cell, wherein the first and the second memory cell are respectively formed in the first and the second junction area on the silicon substrate, wherein the first and the second memory cell comprise conductive gates including an electron trap layer generated in the above channel area, and junction areas of the second conductive type, overlapped with the conductive gate, formed on the substrate, and connected to each bit line of the pair of bit lines, and wherein one of the first and the second memory cell functions as a data cell for storing data and the other of the first and the second memory cell functions as a selection cell for selecting a cell, and each of the first and the second memory cell store one-bit data, the method of erasing data comprising the step of: applying a low voltage to one bit line, and to one word line of the pair of word lines of the selection cell; applying a high voltage to the other bit line of the pair of bit lines of the selection cell, and a ground voltage to the other word line of the pair of word lines of the selection cell; and injecting holes formed in the channel area of the selection cell to electron injection layer by the ground voltage applied to the other word line of the pair of word lines of the selection cell.

To achieve a purpose according to the present invention, the present invention discloses a method of reading a bit data from a first and a second memory cell of a unit cell in a non-volatile memory device independently from each other, comprising a pair of bit lines, a pair of word lines, and a unit cell between the pair of bit lines including a first and a second memory cell, wherein the first and the second memory cell are respectively formed in the first and the second junction area on the silicon substrate, wherein the first and the second memory cell respectively comprise conductive gates including an electron trap layer generated in the above channel area, and junction areas of the second conductive type, overlapped with the conductive gate, formed on the substrate, and connected to each bit line of the pair of bit lines, and wherein one of the first and the second memory cell functions as a data cell for storing a data and the other of the first and the second memory cell functions as a selection cell for selecting a cell, and each of the first and the second memory cell store respectively one bit data, the method of reading a data, comprising the step of: applying a readout voltage to one bit line of the pair of the bit lines of the selection cell and a low voltage to one word line of the pair of word lines of the selection cell; applying a ground voltage to the other bit line of the pair of bit lines of the selection cell, and a readout voltage to the other word line of the pair of word lines of the selection cell; and reading a stored data in the selection cell according to on/off of the data cell.

The present invention is also directed to a fabrication method of a non-volatile memory device comprising the steps of: supplying a silicon substrate of a first conductive type; fabricating an insulation layer having a window for exposing a predetermined area of the silicon substrate;

fabricating a first conductive gate in a spacer shape, comprising a fist dielectric layer in a side wall of the insulation layer within the window; etching back the insulation layer; fabricating a second conductive gate in a spacer shape in a side wall of the first conductive gate, comprising a second dielectric layer and facing the first conductive gate; fabricating junction areas of a second conductive gate overlapping with the first and the second conductive gate.

In one embodiment, the insulation layer comprises a pad oxide layer and a nitride layer formed on the silicon substrate.

In one embodiment, each of the first and second dielectric layers comprises an oxide-a nitride-an oxide ONO layer.

In one embodiment, the first and the second dielectric layers fabricated between the first and the second conductive gate facing each other insulate the first and the second conductive gate from each other.

In one embodiment, each of the first and second conductive gates comprises a polysilicon layer.

In one embodiment, the fabrication method of the first conductive gate including the first dielectric layer comprises: fabricating a first ONO layer including a first oxide layer, a nitride layer and a second oxide layer upon the insulation layer including the window; fabricating a polysilicon layer on the second oxide layer of the first ONO layer; and fabricating the first dielectric layer and the first conductive gate in a side wall of the window by an etch-back process for the first ONO layer and the polysilicon layer.

In one embodiment, the fabrication method of the second conductive gate including the second dielectric layer comprises: fabricating a second ONO layer including a first oxide layer, a nitride layer and a second oxide layer on the silicon substrate including the first conductive gate; fabricating a polysilicon layer on the second oxide layer of the second ONO layer; and fabricating the second dielectric layer and the second conductive gate in a side wall of the first conductive gate by an etch-back process for the second ONO layer and the polysilicon layer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1A:
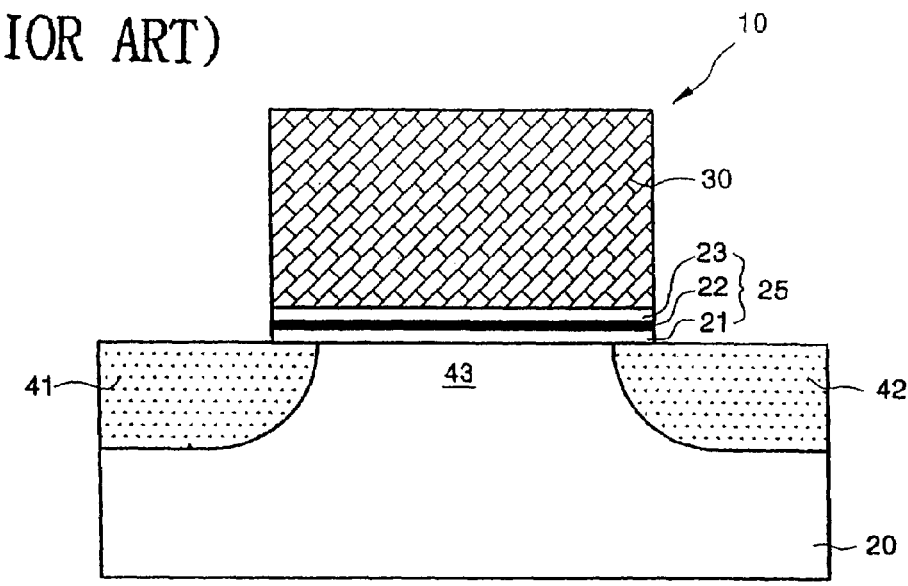
FIG. 1A and FIG. 1B are a cross-sectional configuration and an equivalent circuit diagram, respectively, of a conventional EEPROM device having one-bit one-transistor.
Figure 1B:
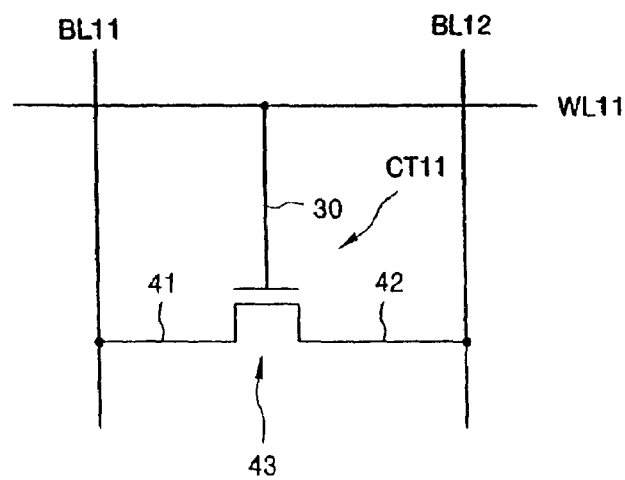
Figure 2A:
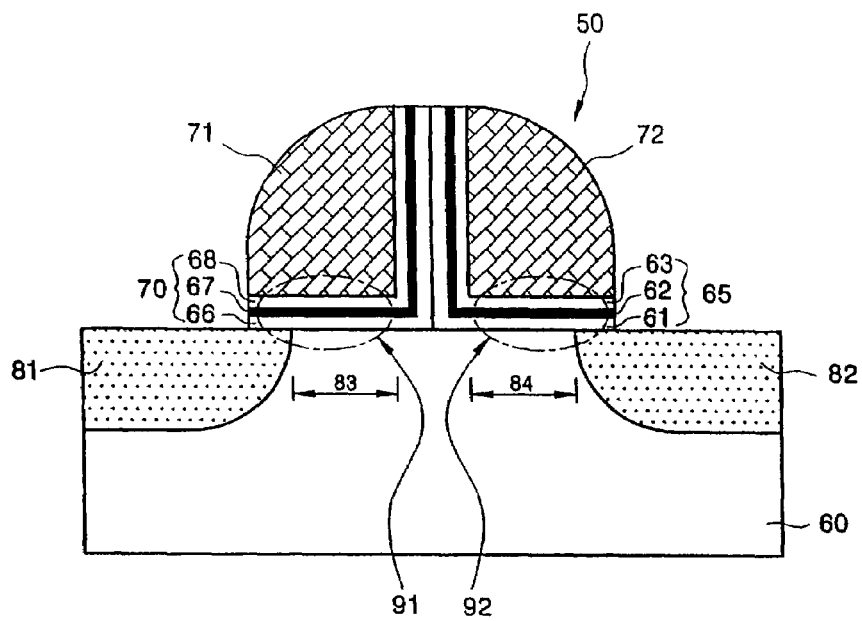
FIG. 2A and FIG. 2B are a cross sectional configuration and an equivalent circuit diagram, respectively, of an EEPROM device having two transistors for two bit operations according to the present invention.
Figure 2B:
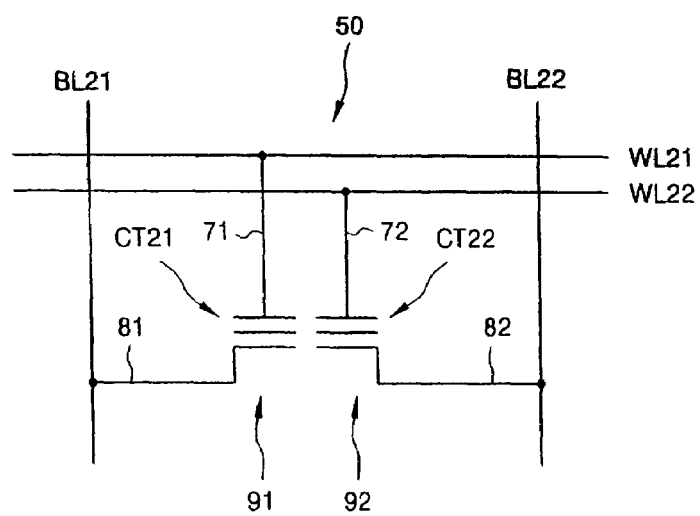

FIG. 2A shows a cross sectional configuration of a unit cell of an EEPROM device according to the present invention. The EEPROM device has a structure of silicon-oxide-nitride-oxide-semiconductor SONOS, wherein the SONOS structure has a split word line. FIG. 2B is an equivalent circuit diagram of a unit cell of the EEPROM device with a split word line.

Referring to FIG. 2A and FIG. 2B, in the EEPROM device according to the present invention, a first junction area 81 connected to a first bit line BL21 and a second junction area 82 connected to a second bit line BL22 are fabricated. The first bit line BL21 and the second bit line BL22 belong to a pair of bit lines on a silicon substrate 60. The silicon substrate 60 is a conductive substrate, for example, such as a p-type substrate. In addition, the first junction area 81 and the second junction area 82 are of the conductivity type opposite to that of the substrate 60, for example, n-type.

A first channel area 83 and a second channel area 84 are formed between the first junction area 81 and the second junction area 82. A first conductive gate 71 on the first channel area 83 and a second conductive gate 72 on the second channel area 84 are overlapped with the first junction area 81 and the second junction area 82. ONO layers 70 and 65 are fabricated to face each other in the bottom of the first conductive gate 71 and the second conductive gate 72, respectively.

Bottom oxide layers 66 and 61 of the ONO layers 70 and 65, respectively, are isolation layers of the channel areas 83 and 84, respectively. Top oxide layers 68 and 63 are electrical isolation layers of the split first and second conductive gates 71 and 72, respectively. Each of the nitride layers 67 and 62 between the top oxide layer and the bottom oxide layer is an electron-trapping layer for data retention.

The ONO layers 70 and 65 are dielectric layers and insulation layers of the first memory cell 91 and the second memory cell 92, respectively. The areas of the ONO layers 70 and 65 formed in the channel areas 83 and 84 function as dielectric layers of the first memory cell 91 and the second memory cell 92, respectively. The areas of the ONO layers fabricated adjacent to the split first and second conductive gates 71 and 72 function as isolation layers for isolating the split first and second conductive gates 71 and 72, respectively.

The EEPROM device of the present invention reads/writes data to a memory cell by the CHEI method. Therefore, the ONO layers 70 and 65 have a thickness of about 200 Å for preventing an electron F-N tunneling phenomenon. In addition, the first bottom oxide layer 66, the first nitride layer 67, and the first top oxide layer 68 of the first ONO layer 70 have a thickness of 80 Å, 40 Å, and 80 Å, respectively. The second bottom oxide layer 61, the second nitride layer 62, and the second top oxide layer 63 of the second ONO layer 65 have a thickness of 80 Å, 40 Å, and 80 Å, respectively. It is preferable that the top oxide layers 68 and 63 have the same thickness as the bottom oxide layers 66 and 61.

The EEPROM device of the present invention comprises two memory cells 91 and 92 as a unit cell 50. The two memory cells 91 and 92 are connected to a pair of bit lines BL21 and BL22, respectively. The first and second conductive gates 71 and 72 of the two memory cells 91 and 92 are connected to a pair of word lines WL21 and WL22, respectively. Therefore, the two memory cells 91 and 92 store one bit data. As a result, the unit cell 50 comprising the two memory cells 91 and 92 performs two bit operation.

In the EEPROM device having the above structure according to the present invention, the first memory cell 91 comprises the first conductive gate 71, the first ONO layer 70, and the first junction area 81. The first ONO layer 70 comprises the first nitride layer 67 as an electron-trapping layer. The first junction area 81 as a source area of the first memory cell 91 fabricated on the silicon substrate 60 is overlapped with the first conductive gate 71.

In a similar way, the second memory cell 92 comprises the second conductive gate 72, the second ONO layer 65, and the second junction area 82. The second ONO layer 65 comprises the second nitride layer 62 as an electron-trapping layer. The second junction area 82 as a source area of the second memory cell 92 formed on the silicon substrate 60 is overlapped with the second conductive gate 72.

The unit cell 50 of the EEPROM device according to the present invention comprises two memory cells 91 and 92. The two memory cells 91 and 92, separated from each other, have the first and second conductive gates 71 and 72 formed in the channel areas 83 and 84, respectively. Therefore, the channel areas 83 and 84 are separated from each other a distance that is the sum of the thicknesses of each of the ONO layers 70 and 65.

Referring to FIG. 2B, the unit cell 50 of the EEPROM device according to the present invention comprises two transistors CT21 and CT22 having the corresponding memory cells 91 and 92 between a pair of bit lines BL21 and BL22.

The first transistor CT21 is a transistor having two terminals. One terminal of the first transistor CT21 is the first conductive gate 71 connected to the first word line WL21, and the other terminal, a source of the first transistor CT21, is the junction area 81 connected to the first bit line BL21. In a similar way, one terminal of the second transistor CT22 is the second conductive gate 72 connected to the second word line WL22, and the other terminal, a source of the second transistor 72, is the junction area 82 connected to the second bit line BL22.

The unit cell 50 of the EEPROM device, as shown in FIG. 2B, uses the second transistor CT22 as a selection transistor, while the first transistor CT21 functions as a cell transistor for storing data. On the contrary, the first transistor CT21 is a selection transistor in the case that the second transistor CT22 functions as a cell transistor. Therefore, the unit cell 50 stores two bit data because two transistors CT21 and CT22 of the unit cell 50 each store one bit data.

Drawings from FIGS. 3A and 3B to FIGS. 8A and 8B, are cross sectional configurations and equivalent circuit diagrams, respectively, illustrating data programming, data erasing, and data readout in the EEPROM device according to the present invention.

The unit cell 50 of the EEPROM device according to the present invention comprises two memory cells 91 and 92 between a pair of bit lines BL21 and BL22, and the unit cell 50 stores two bit data because each of the two memory cells 91 and 92 stores one bit data.

When the first memory cell 91 functions as a data cell and the second memory cell 92 functions as a selection cell, in other words, the first transistor CT21 functions as a cell transistor and the second transistor CT22 functions as a selection transistor, a data programming and erasing will be illustrated in the following statements.

Figure 3A:
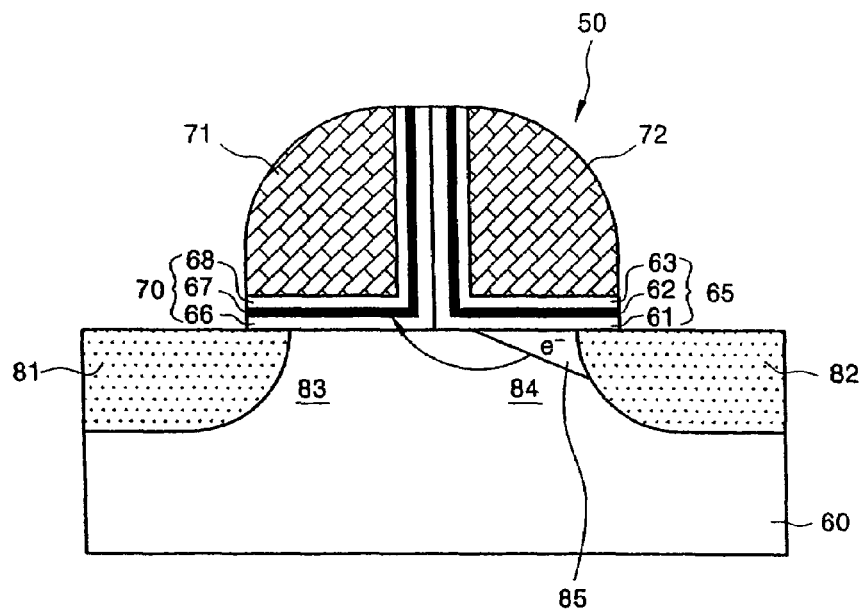
FIG. 3A and FIG. 3B are a cross sectional configuration and an equivalent circuit diagram, respectively, of programming data to a first memory cell of the EEPROM device according to the present invention.
Figure 3B:
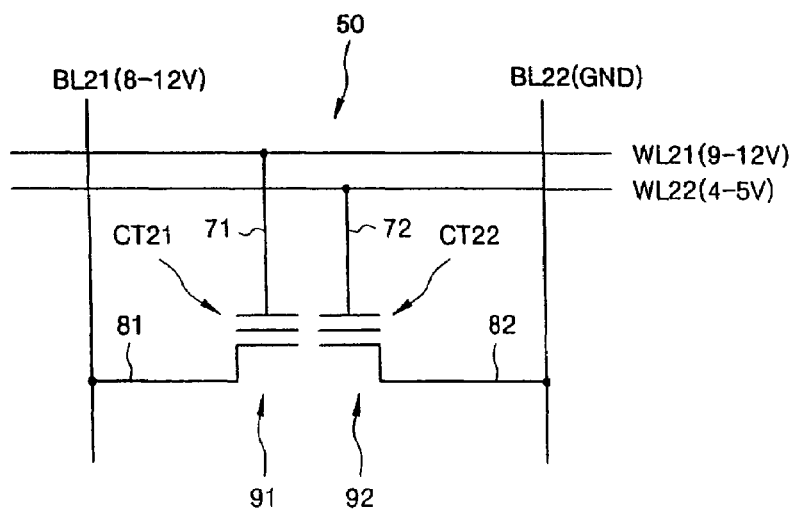

FIG. 3A and FIG. 3B illustrate a cross sectional configuration and an equivalent circuit diagram, respectively, of programming data to a first memory cell 91 of the EEPROM device according to the present invention.

When data is programmed in the first memory cell 91, the first transistor CT21 is a cell transistor and the second transistor CT22 is a selection transistor. Therefore, the first conductive gate 71 is a control gate and the second conductive gate 72 is a selection gate.

To program data to the first memory cell 91, a high voltage is applied to the control gate of the first conductive gate 71, and a low voltage of 4 to 5 V is applied to the selection gate of the second conductive gate 72. In addition, a high voltage is applied to the first bit line BL21 connected to the first junction area 81, and the ground voltage GND is applied to the silicon substrate 60 and the second bit line BL22 connected to the second junction area 82.

The same level of high voltage can be applied to the first conductive gate 71 and the first bit line BL21. However, to improve programming efficiency, it is preferable that a high voltage of 9 to 12 V be applied to the first conductive gate 71 and a high voltage of 8 to 10 V be applied to the first bit line BL21.

By applying the above bias voltages, an inversion layer 85 is formed in the second channel area 84, and electrons are moved from the second junction area 82 to the first junction area 81. The electrons injected into the second channel area 84 are converted to hot electrons by applying the high voltage to the control gate 71, and are trapped on the first nitride layer 67 of the first ONO layer 70. Then, the second junction area 82 functions as a source terminal.

Therefore, the CHEI method accumulates electrons to the first nitride layer 67 as an electron-trapping layer for data programming. A threshold voltage Vth of the first memory cell 91 for data programming raises up to 3.5 V.

Though not shown in FIG. 3A and FIG. 3B, the EEPROM device according to the present invention has a matrix of unit cells, and the unit cells connected to the same row are also connected to the same pair of word lines. When a unit cell is selected in such an EEPROM device, all pairs of word lines except a pair of word lines connected to the unit cell are grounded.

Figure 4A:
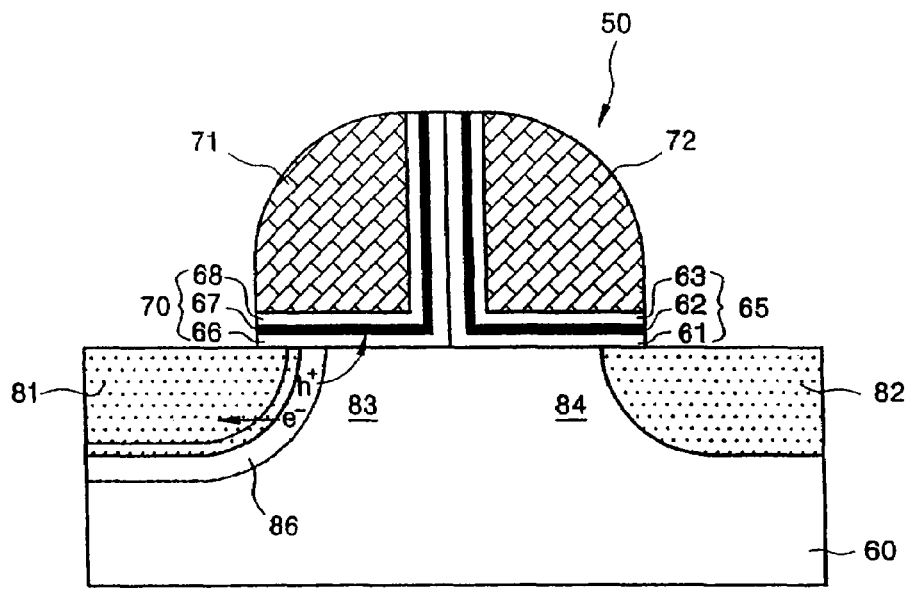
FIG. 4A and FIG. 4B are a cross sectional configuration and an equivalent circuit diagram, respectively, of erasing the programmed data in the first memory cell of the EEPROM device according to the present invention.
Figure 4B:
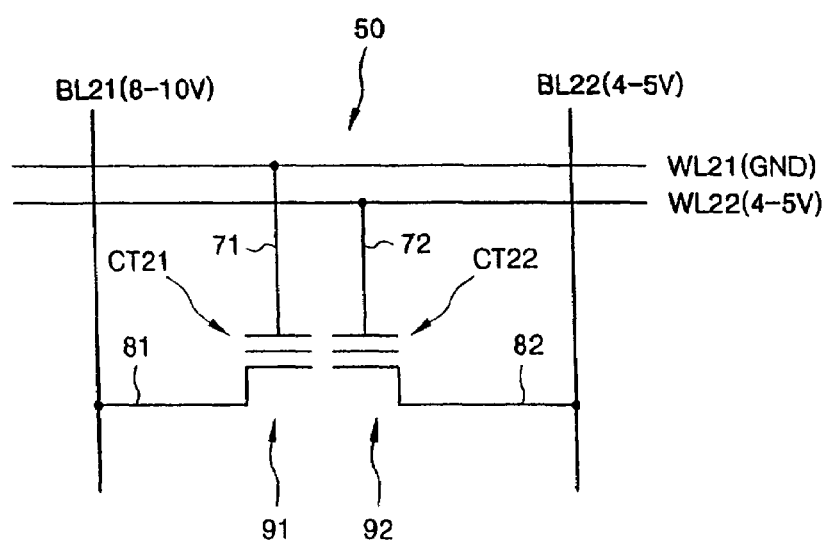

FIG. 4A and FIG. 4B illustrate a cross sectional configuration and an equivalent circuit diagram, respectively, of erasing the programmed data in the first memory cell of the EEPROM device according to the present invention.

To erase data stored in the first memory cell 91, the first conductive gate 71 is grounded, and a low voltage of 4 to 5 V is applied to the second conductive gate 72. In addition, a high voltage of 8 to 10 V is applied to the first junction area

81, a low voltage of 4 to 5 V is applied to the second junction area 82, and the silicon substrate 60 is grounded.

By applying the above bias voltages, a depletion layer 86 is formed between the first junction area 81 and the silicon substrate 60 to generate a pair of an electron and a hole. The electrons e⁻ generated in the depletion layer 86 are released through the first junction area 81, and the holes h⁺ become hot holes injected into the first channel area 83 by applying a high voltage to the first junction area 81.

The hot holes in the first channel area 83 are trapped into the first nitride layer 67 by the word line WL21 employing a ground voltage, and are recombined with electrons accumulated in the first nitride layer 67. Therefore, a band-to-band tunneling method employing hot hole injection erases the programmed data in the first memory cell 91. Then, the threshold voltage Vth of the first memory cell 91 for erasing data lowers to 1.5 V.

All unit cells except unit cells connected to the same row with the selection unit cell 50 apply a low voltage of 4 to 5 V to the junction areas and the gates.

Figure 5A:
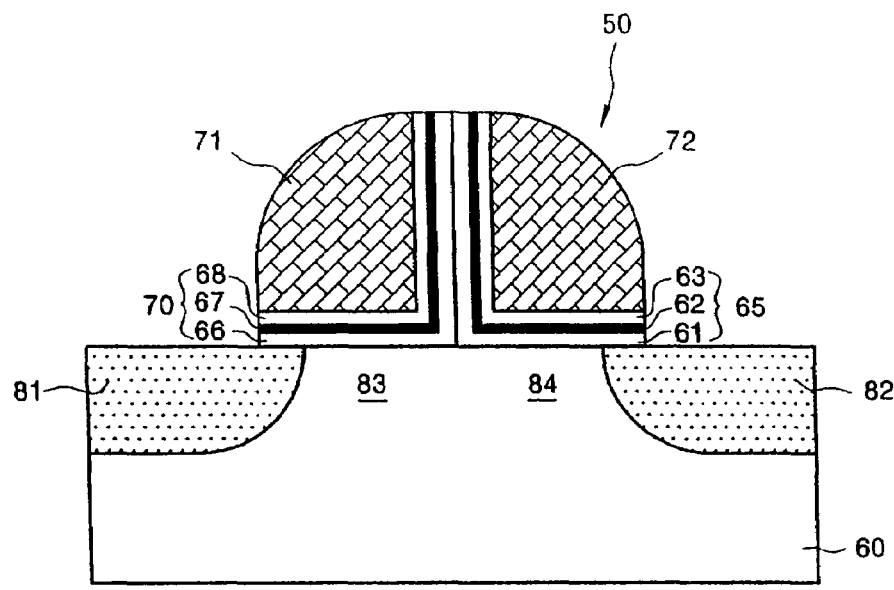
FIG. 5A and FIG. 5B are a cross sectional configuration and an equivalent circuit diagram, respectively, of reading out data from the programmed data in the first memory cell of the EEPROM device according to the present invention.
Figure 5B:
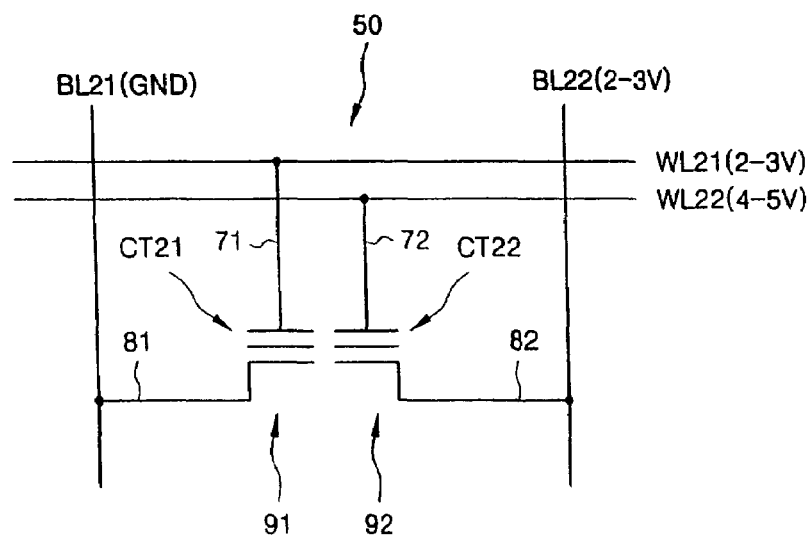
Figure 6A:
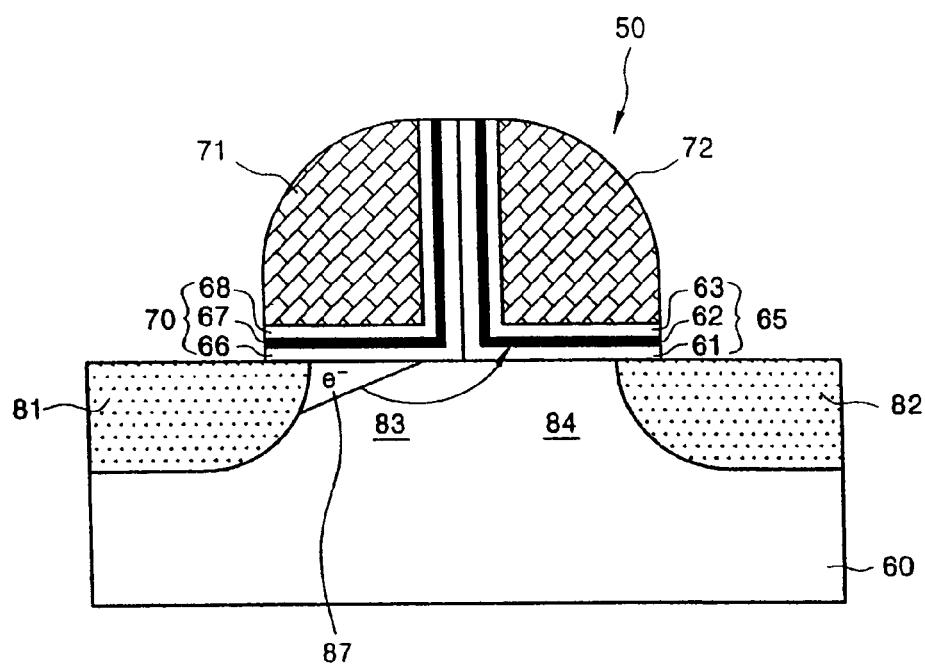
FIG. 6A and FIG. 6B are a cross sectional configuration and an equivalent circuit diagram, respectively, of programming data to a second memory cell of the EEPROM device according to the present invention.
Figure 6B:
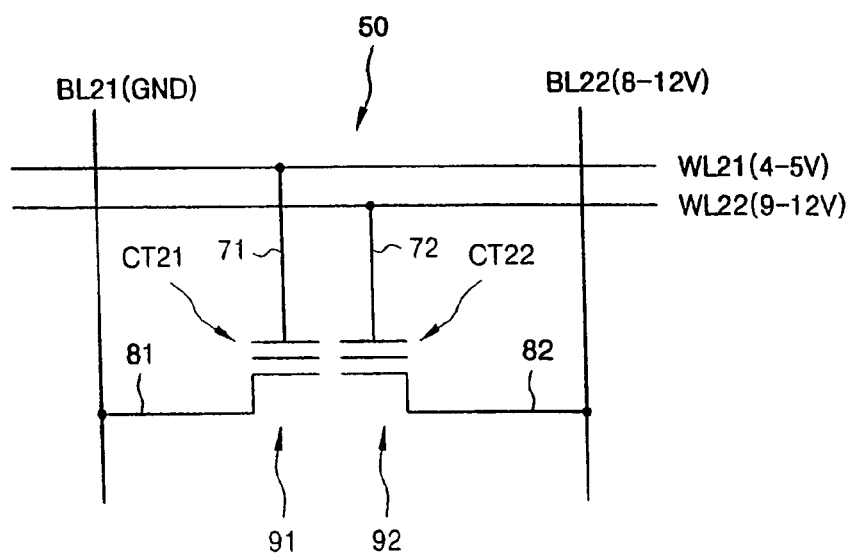
Figure 7A:
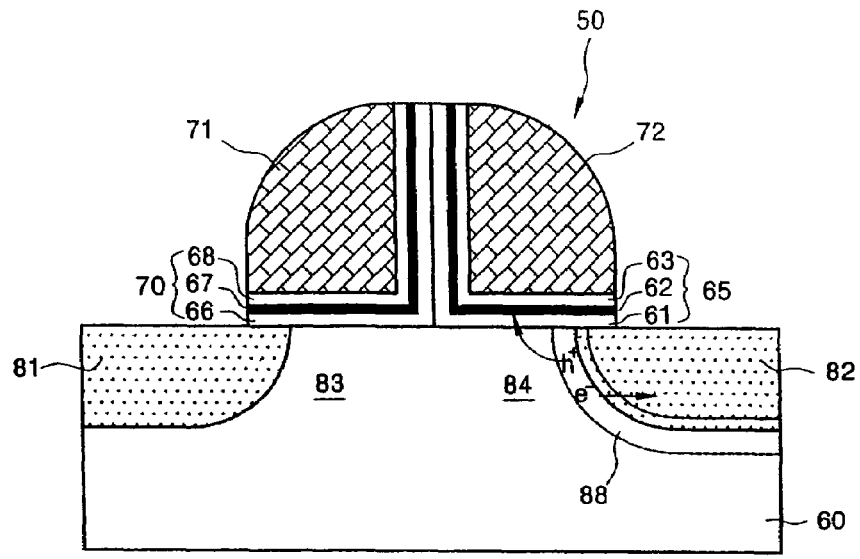
FIG. 7A and FIG. 7B are a cross sectional configuration and an equivalent circuit diagram, respectively, of erasing data of the programmed data in the second memory cell of the EEPROM device according to the present invention.
Figure 7B:
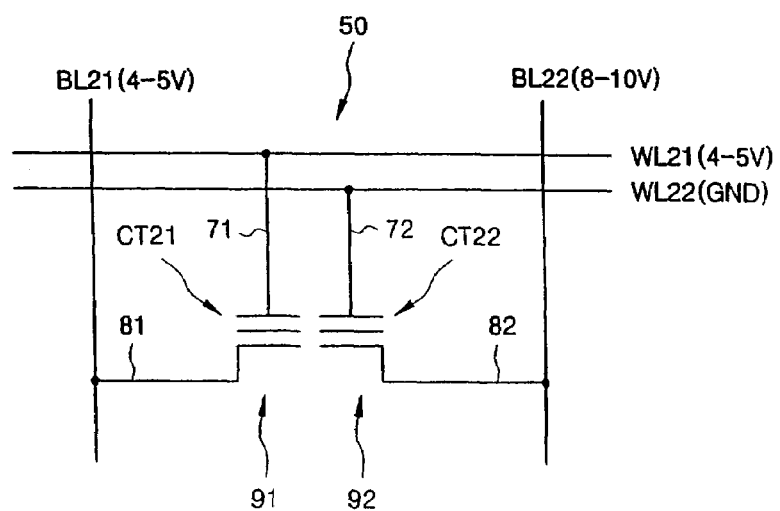
Figure 8A:
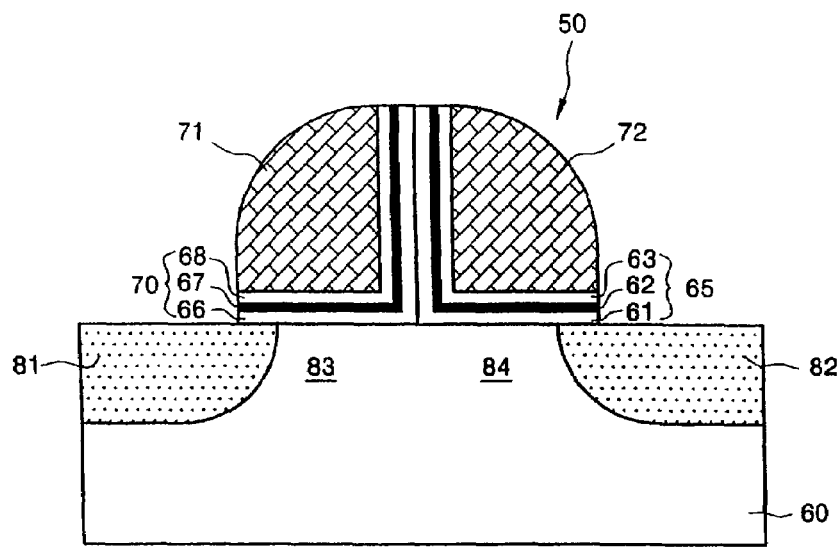
FIG. 8A and FIG. 8B are a cross sectional configuration and an equivalent circuit diagram, respectively, of reading out the programmed data in the second memory cell of the EEPROM device according to the present invention.
Figure 8B:
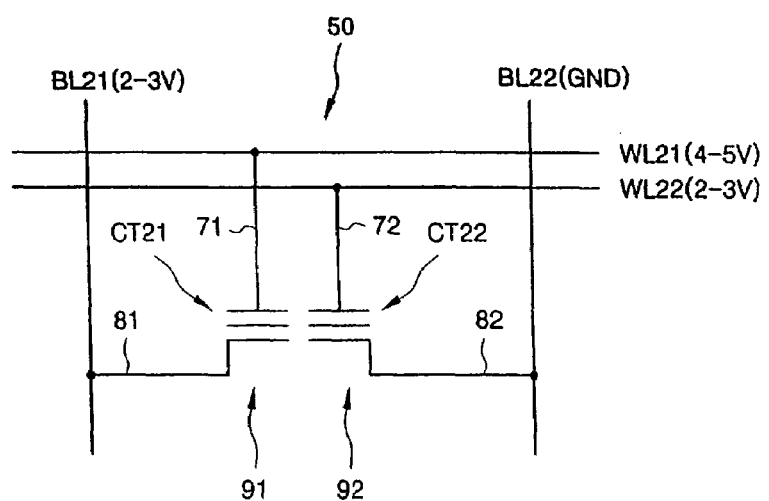

FIG. 5A and FIG. 5B illustrate a cross sectional configuration and an equivalent circuit diagram, respectively, of reading the programmed data in the first memory cell of the EEPROM device according to the present invention.

Drawings from FIGS. 6A and 6B to FIGS. 8A and 8B are cross sectional configurations and equivalent circuit diagrams, respectively, illustrating data programming, data erasing, and data readout in the case that the first transistor functions as a selection transistor and the second transistor functions as a cell transistor.

When the second transistor functions as a cell transistor, the operation of programming, erasing, or reading data of the second memory cell, sets opposite bias voltage conditions, especially to the first and the second memory cell, compared to the operations of programming, erasing, or reading data of the first memory cell. The function of drawings from FIGS. 6A and 6B to FIGS. 8A and 8B is similar with that of drawings from FIGS. 3A and 3B to FIGS. 5A and 5B.

Table 1 lists applied voltages during data programming, data erasing, and data readout when the first memory cell is a cell transistor and the second memory cell is a selection transistor. Table 1 also lists applied voltages for data programming, data erasing, and data readout when the second memory cell is a cell transistor and the first memory cell is a selection transistor.

TABLE 1

| | Selection cell | BL21 | BL22 | WL21 | WL22 | Silicon Substrate |
|---|---|---|---|---|---|---|
| Data programming | The first memory cell | 8–10 V | GND | 9–12 V | 4–5 V | GND |
| | The second memory cell | GND | 8–10 V | 4–5 V | 9–12 V | GND |
| Data erasing | The first memory cell | 8–10 V | 4–5 V | GND | 4–5 V | GND |
| | The second memory cell | 4–5 V | 8–10 V | 4–5 V | GND | GND |
| Data readout | The first memory cell | GND | 2–3 V | 2–3 V | 4–5 V | GND |
| | The second memory cell | 2–3 V | GND | 4–5 V | 2–3 V | GND |

When programmed data is read, the first junction area 81 is grounded and a voltage of 2 to 3 V is applied to the first conductive gate 71. In addition, a readout voltage of 2 to 3 V is applied to the second junction area 82, and a low voltage of 4 to 5 V is applied to the second conductive gate 72.

The readout voltage between a maximum threshold voltage Vth of 3.5 V for data programming and a minimum threshold voltage Vth of 1.5 V for erasing data, has a voltage of 2 to 3 V, preferably.

The above bias voltage reads programmed data in the first memory cell 91 by the current flowing through the first channel area 83.

For example, when the first memory cell 91 stores data of a logic 'high' level, a programming threshold voltage Vth is 3.5 V. When data is programmed in the first memory cell 91, the first memory cell 91 is turned off and the current does not flow through the first channel area 83 by the programming threshold voltage Vth. In this case, programmed data is read.

On the contrary, when the first memory cell 91 is not programmed, for example, the first memory cell 91 stores data of a logic 'low' level, threshold voltage Vth is lower than 3.5 V. In this case, the first memory cell 91 is turned on.

When data is read, the second memory cell 92 is always turned on. Therefore, current flows through the channel areas 83 and 84 to show that a data is not programmed.

When data is programmed, data of a logic 'high' level is stored. However, data of a logic 'low' level can be stored according to the kind of a memory cell.

The EEPROM device according to the present invention has junction areas connected to a pair of bit lines, and has conductive gates connected to a pair of word lines. The EEPROM device also has an ONO dielectric layer in the bottom of each of the conductive gates. As a result, the unit cell comprising two cell transistors stores two bit data. Therefore, the EEPROM device having two transistors improves integration degree and electron-trapping efficiency of the EEPROM device by the CHEI method.

Figure 9A:
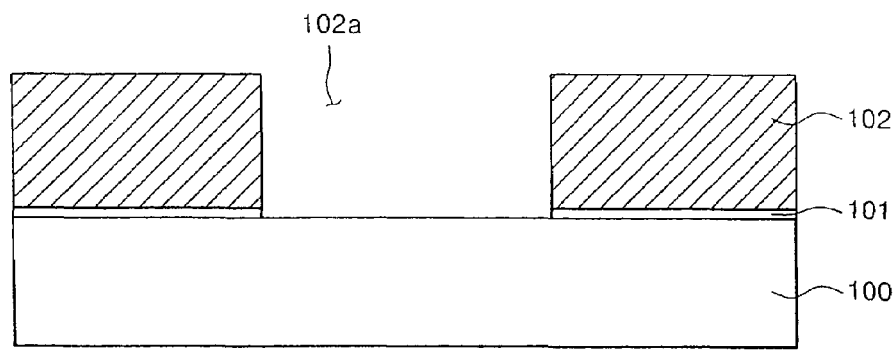
FIG. 9A to FIG. 9G are cross sectional diagrams illustrating a method of fabricating an EEPROM device according to the present invention.

Process cross sectional diagrams from FIG. 9A to FIG. 9G illustrate a method of fabricating an EEPROM device according to the present invention. Referring to FIG. 9A, a pad oxide layer 101 and a nitride layer 102 are stacked on the silicon substrate 100 of a predetermined conductive type, for example, p-type. After a photolithography process is applied to pattern and to etch back the pad oxide layer 101 and the nitride layer 102, a window 102a is generated.

Figure 9B:
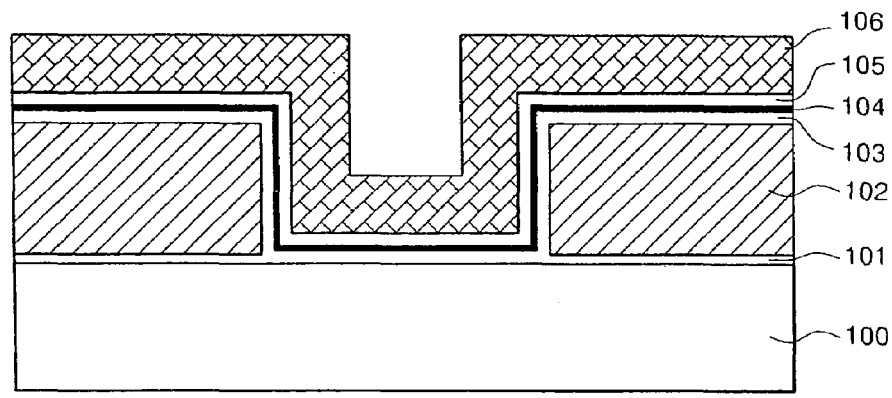

Referring to FIG. 9B, an oxide layer 103, a nitride layer 104, an oxide layer 105, and a polysilicon layer 106 are stacked on the nitride layer 102 including the window 102a.

Figure 9C:
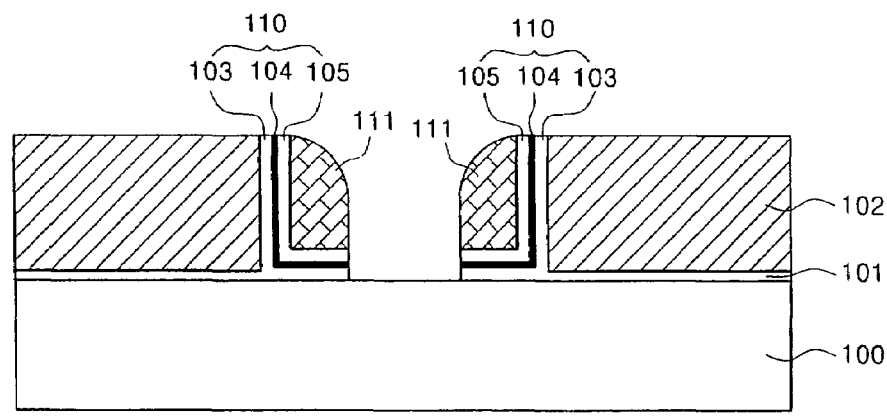

Referring to FIG. 9C, the polysilicon layer 106, the oxide layer 105, the nitride layer 104 and the oxide layer 103 are etch-backed to generate an ONO layer 110 comprising a second conductive gate 111, the oxide layer 103, the nitride layer 104, and the oxide layer 105. The ONO layer 110 is formed in a spacer shape in a side wall of the window 102a.

Figure 9D:
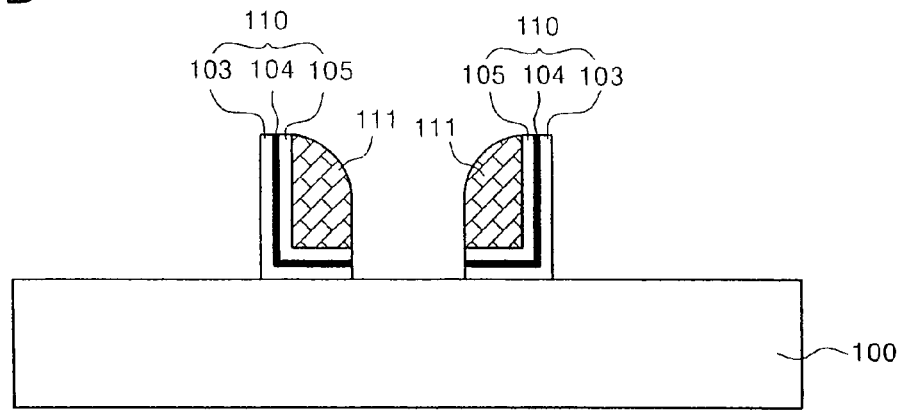

Referring to FIG. 9D, the nitride layer 102 and the pad oxide layer 101 are eliminated by an etching process.

Figure 9E:
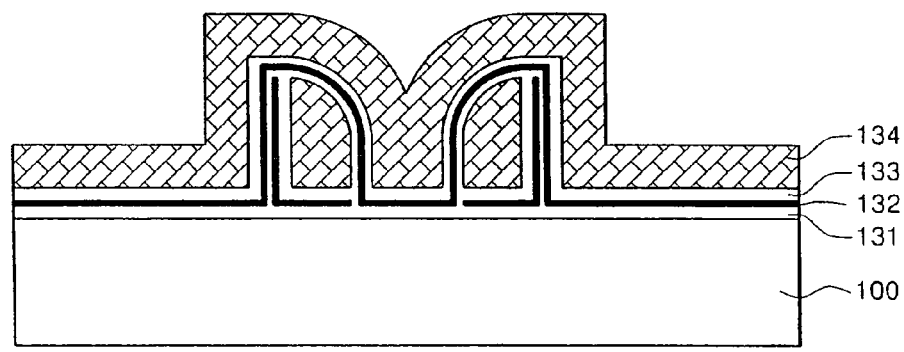

Referring to FIG. 9E, an oxide layer 131, a nitride layer 132, an oxide layer 133, and a polysilicon layer 134 are stacked on the silicon substrate 100.

Figure 9F:
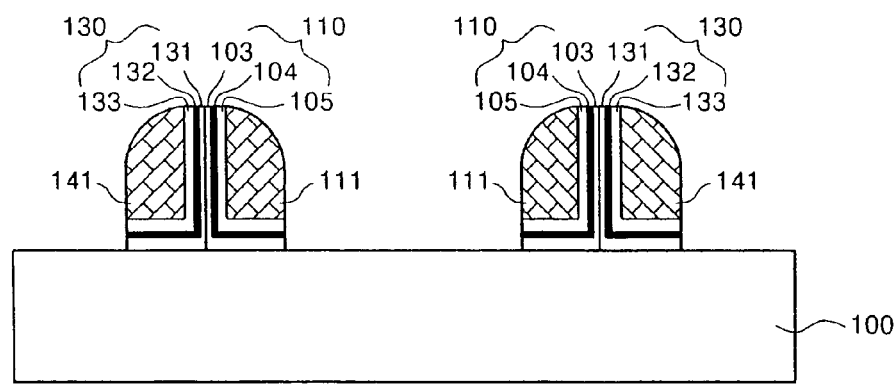

Referring to FIG. 9F, the polysilicon layer 134, the oxide layer 133, the nitride layer 132, and the oxide layer 131 are etch-backed to generate a first conductive gate 141 and a first ONO layer 130 facing the second conductive gate 111 and the second ONO layer 110. The first gate 141 is a spacer generated in a side wall of the second gate 111.

Figure 9G:
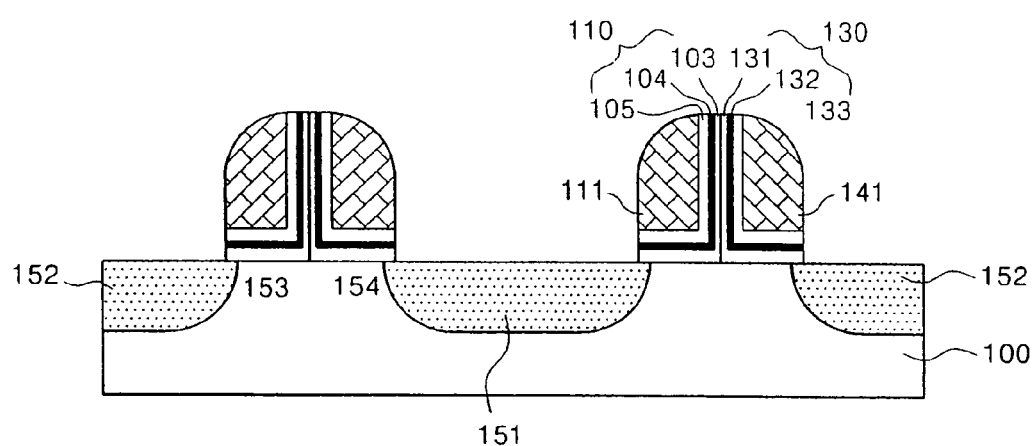

Referring to FIG. 9G, an impurity of reverse conductivity type to that of the silicon substrate 10, for example, an n-type impurity, is ion-implanted into the exposed silicon substrate 100 to generate junction areas 151 and 152. The junction areas 151 and 152 are overlapped with the conductive gates 111 and 141 to generate the channel areas 153 and 154. Therefore, a two-bit two-transistor EEPROM device is fabricated.

The above mentioned fabrication method of the EEPROM device according to the present invention generates the conductive gates 111 and 141 in a self-alignment method. Therefore, the fabrication method of the EEPROM device is not limited by a design rule according to the degree of resolution, which has an advantage that the fabrication method can reduce the cell size of the EEPROM device.

The EEPROM device according to the present invention has two memory cells storing two bit data between a pair of bit lines to improve integration degree of the EEPROM device. The CHEI method applied to the EEPROM device according to the present invention improves electron-trapping efficiency during data programming, which results in reducing trapping currents. In addition, a unit cell having two memory cells increases disturbance resistance to improve device reliability. The conductive gates formed as a spacer by the self-align method can reduce cell size, while the size of cells is not limited by a design rule.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A non-volatile memory device comprising:
   a silicon substrate having first and second channel areas adjacent to each other;
   first and second conductive gates located over the first and the second channel areas respectively;
   a first ONO layer between the first conductive gate and the first channel area, the first ONO layer having a first thickness;
   a second ONO layer between the second conductive gate and the second channel area, the second ONO layer having a second thickness; and
   first and second junction areas adjacent to the first and the second channel areas respectively, the first and second junction areas being provided in the silicon substrate, wherein a top portion of the first channel area is separated from a top portion of the second channel area by a sum of the first thickness of the first ONO layer and the second thickness of the second ONO layer.

2. The non-volatile memory device according to claim 1, wherein the first conductive gate, the first channel area, the first ONO layer and the first junction area constitute a first memory cell, and the second conductive gate, the second channel area, the second ONO layer and the second junction area constitute a second memory cell.

3. The non-volatile memory device according to claim 1, wherein the first conductive gate acts as a control gate and the second conductive gate acts as a selection gate.

4. The non-volatile memory device according to claim 1, wherein the first conductive gate acts as a selection gate and the second conductive gate acts as a control gate.

5. The non-volatile memory device according to claim 1, wherein the first and the second ONO layers extend to fill a space between the first and second conductive gates.

6. The non-volatile memory device according to claim 1, wherein each of the first and the second ONO layers comprises a bottom oxide layer, a top oxide layer, and a nitride layer between the bottom oxide layer and the top oxide layer.

7. The non-volatile memory device according to claim 1, wherein the first and the second conductive gates have a spacer shape.

8. The non-volatile memory device according to claim 7, wherein each of the first and the second conductive gates has a vertical inner sidewall, a flat bottom surface and a rounded outer sidewall, and the vertical inner sidewalls of the first and the second conductive gates face each other.

9. The non-volatile memory device according to claim 1, further comprising a pair of bit lines connected to the first and the second junction areas respectively.

10. The non-volatile memory device according to claim 1, further comprising a pair of word lines connected to the first and the second conductive gates respectively.

* * * * *